United States Patent
Zimmerman

(10) Patent No.: US 7,030,703 B2
(45) Date of Patent: Apr. 18, 2006

(54) CIRCUIT ARRANGEMENT COMPRISING CASCADE FIELD EFFECT TRANSISTORS

(75) Inventor: Walter Zimmerman, Dorfen (DE)

(73) Assignee: Infineon Technologies AG, Munich (DE)

(*) Notice: Subject to any disclaimer, the term of this patent is extended or adjusted under 35 U.S.C. 154(b) by 75 days.

(21) Appl. No.: 10/477,626

(22) PCT Filed: Apr. 18, 2002

(86) PCT No.: PCT/EP02/03867

§ 371 (c)(1),
(2), (4) Date: May 21, 2004

(87) PCT Pub. No.: WO02/093734

PCT Pub. Date: Nov. 21, 2002

(65) Prior Publication Data

US 2004/0217819 A1    Nov. 4, 2004

(30) Foreign Application Priority Data

May 14, 2001  (DE) ............................... 101 23 395

(51) Int. Cl.
  *H03F 3/04* (2006.01)
  *H03F 3/68* (2006.01)
(52) U.S. Cl. .................... 330/310; 330/227; 330/296

(58) Field of Classification Search ................ 330/310, 330/277, 296, 311
See application file for complete search history.

(56) References Cited

U.S. PATENT DOCUMENTS 5,337,019 A     8/1994  Musiol
5,994,963 A *  11/1999  Kawai et al. ............... 330/277
6,617,927 B1 *  9/2003  Numanami et al. ......... 330/277

FOREIGN PATENT DOCUMENTS

DE     3017654 C2   6/1990
DE     4134177      4/1993

* cited by examiner

*Primary Examiner*—Zandra V. Smith
*Assistant Examiner*—Hieu Nguyen
(74) *Attorney, Agent, or Firm*—Baker Botts L.L.P.

(57) ABSTRACT

A circuit arrangement in which cascaded first and second operating transistors have gate terminals connected to an input signal and a control voltage, respectively. A control path from the control voltage source to the gate terminal of the second operating transistor includes a voltage divider. First and second circuit units are also provided in the control path to selectively enable and disable the voltage divider according to a voltage level of the applied control voltage, thereby causing the circuit to have desirable control characteristics.

14 Claims, 5 Drawing Sheets

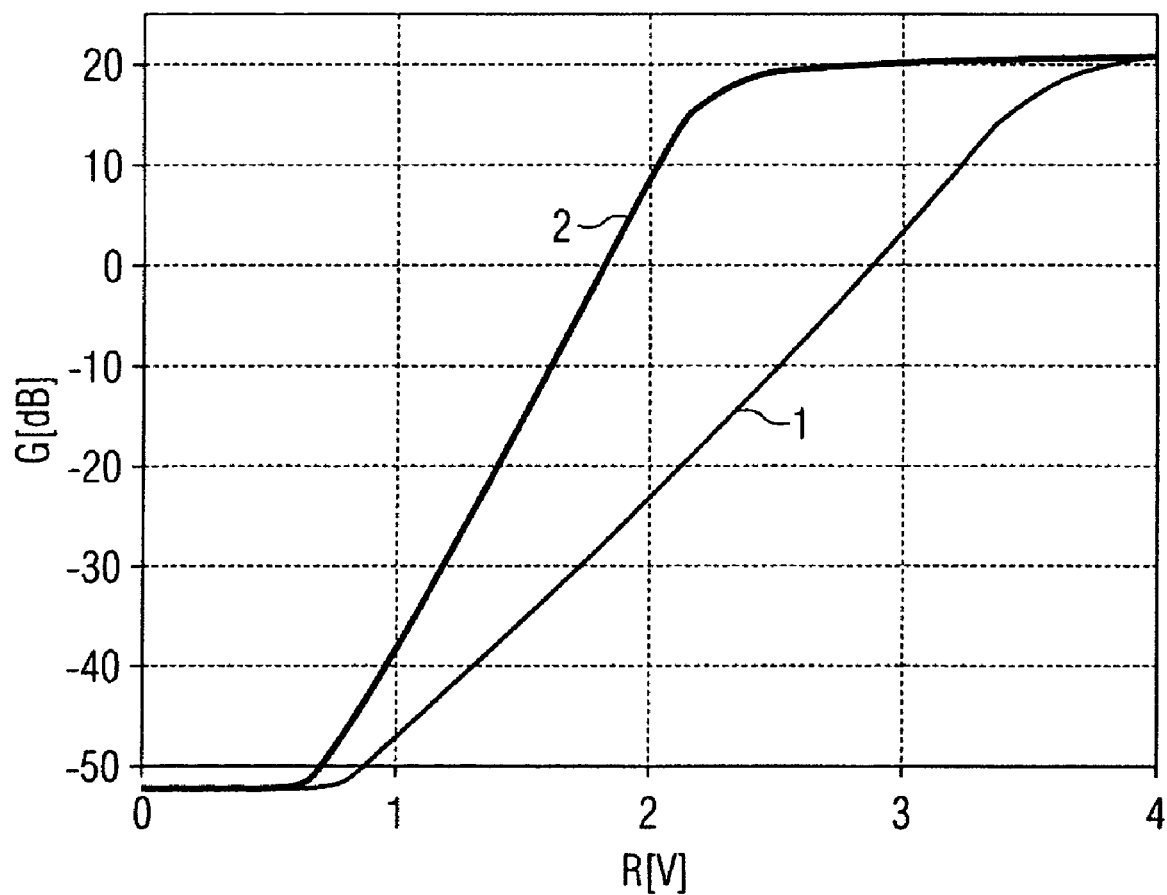

CIRCUIT ARRANGEMENT COMPRISING CASCADE FIELD EFFECT TRANSISTORS

FIELD OF THE INVENTION

The present invention relates to a circuit arrangement comprising cascaded field effect transistors. The present invention relates in particular to a circuit arrangement comprising cascaded field effect transistors for high-frequency applications.

BACKGROUND OF THE INVENTION

Circuit arrangements comprising cascaded field effect transistors, for example tetrodes or pentodes, are often used as controllable amplifiers for high-frequency applications. The cascaded field effect transistors have a plurality of gate terminals, the signal to be processed generally being applied to a first gate while a second gate is used to control the gain. In this case, the control is intended to cover a large gain interval (e.g., 70 dB). A circuit arrangement of this type is shown, for example, in the document DE 41 34 177.

Regulating the gain of MOS tetrodes/pentodes is generally carried out by ramping down the voltage which is applied to the second gate. A linearized control response, a high control range and low intermodulation distortion is achieved if, associated with the ramping down of the voltage which is applied to the second gate, the potential on the first gate is ramped up. In earlier circuit arrangements comprising cascaded field effect transistors, for example tuner circuits for television receivers, this was achieved by a circuit for stabilizing the operating current, which normally comprised a source resistor.

FIG. 8 shows such a circuit arrangement schematically, which comprises two cascaded field effect transistors AT1 and AT2 and a source resistor $R_s$ and a capacitor $C_s$ for high-frequency blocking. The signal E to be amplified is connected to the gate electrode G1 of the first field effect transistor AT1, while the control of the gain is carried out via a signal R which is applied to the gate electrode G2 of the second field effect transistor AT2. Although the additional source resistor $R_s$ reduced the useable supply voltage by about 3 volts, this disadvantage could be tolerated, since these circuits were normally operated with supply voltages of 9 to 12 volts. FIG. 9 shows the behavior of this circuit using the example of the gain of the circuit as a function of the voltage applied to the gate electrode G2 (dashed line). It can be seen that the gain of the circuit may be controlled largely linearly over a relatively wide range with the voltage applied to the gate electrode G2.

In modern electronic signal processing, smaller and smaller operating voltages are being used. This in turn results in the situation where a source resistor $R_s$, as shown in FIG. 8, cannot be used in modern circuit arrangements, since otherwise too small a proportion of the supply voltage is available for the two cascaded field effect transistors AT1 and AT2. However, because the source resistor $R_s$ is missing, the substantial control range is now determined solely by the transistor characteristics.

FIG. 9 shows the behavior of such a circuit without a source resistor $R_s$ (continuous line). Starting from a ramped-up state, the ramping-down action is initially carried out very moderately, in order then to change to a short and steep drop. Therefore, the actual control of the gain is carried out over a relatively small interval for the voltage applied to the gate electrode G2. Because of the short and steep drop of the gain, however, it becomes more and more difficult to use the circuit within a complete control loop for controlling the signal gain since, in the range of the short and steep drop, even small changes in the voltage supplied to the gate electrode G2 and small deviations in the transistor characteristics lead to drastic changes in the gain of the control path. Increasingly refined transistors and the trend to lower operating voltages intensify these characteristics.

SUMMARY OF THE INVENTION

It is therefore an object of the invention to specify a circuit arrangement comprising cascaded field effect transistors which reduces or totally avoids the aforementioned problems. It is an object of the invention in particular to specify a circuit arrangement comprising cascaded field effect transistors which ensures an extended and linearized control response between a defined start and end point.

The object is achieved by a circuit arrangement comprising at least two cascaded field effect transistors as claimed in patent claim 1. Further advantageous embodiments, refinements and aspects of the present invention emerge from the dependent patent claims, the description and the appended drawings.

According to the invention, a circuit arrangement comprising at least two cascaded field effect transistors is provided, in particular for high-frequency applications, which has a source terminal, a drain terminal, at least one input signal terminal, which is connected to the gate electrode of a first operating transistor, and at least one control voltage terminal, which is connected to the gate electrode of a second operating transistor. The circuit arrangement according to the invention is characterized in that a voltage divider, which is arranged between the control voltage terminal and the gate electrode of the second operating transistor, a first circuit unit, which is connected to the control voltage terminal and which activates the voltage divider above a first, predefined threshold voltage, and a second circuit unit, which is connected to the control voltage terminal and which deactivates the voltage divider above a second, predefined threshold voltage, which is higher than the first threshold voltage, are provided.

The circuit arrangement according to the invention therefore has the advantage that the extension of the control path is established from a defined threshold, and the final ramping up is compressed into a small interval. The actual control of the gain is therefore carried out over a considerably enlarged interval, as a result of which the circuit arrangement according to the invention can be used in a relatively straightforward manner within a complete control loop for the improved control of the signal gain.

Furthermore, the circuit arrangement according to the invention has the advantage that it can be matched in terms of its dimensioning in a simple way to the characteristics of the cascaded operating transistors and to the requirements of the respective application.

In a preferred embodiment, the voltage divider comprises a first arm with at least one first resistor and a second arm with at least one second resistor, the gate electrode of the second operating transistor being connected to a node which is arranged between the first and the second arm of the voltage divider, and the control voltage terminal being connected to the second arm of the voltage divider.

In a further preferred embodiment, the first circuit unit provided is a first control transistor, which is connected in the first arm of the voltage divider, in series with the first resistor. In this case, it is in particular preferred for the first control transistor to have the same threshold voltage as the second operating transistor. Furthermore, it is preferred for the drain terminal of the first control transistor and the gate electrode of the first control transistor to be connected.

In a further preferred embodiment, the second circuit unit has at least one second control transistor, which is connected in the second arm of the voltage divider, parallel to the second resistor. In this case, it is in particular preferred for the second transistor to be a p-channel transistor of the "normally off" type.

In a further preferred embodiment, the second circuit unit has at least one second control transistor, which is connected in the first arm of the voltage divider, in series with the first resistor. In this case, it is in particular preferred for the second control transistor to be an n-channel transistor of the "normally on" type.

In a further preferred embodiment, the control voltage terminal is additionally connected via a capacitor to the gate electrode of the second operating transistor. Furthermore, it is preferred for a bias circuit for the gate electrode of the first operating transistor to be provided. In this case, it is in particular preferred for the bias circuit to have at least two cascaded field effect transistors, whose gate electrodes are connected to the gate electrodes of the first and second operating transistors, respectively.

BRIEF DESCRIPTION OF THE DRAWINGS

The invention will be explained in more detail below using the figures of the drawing, in which:

FIG. 2 shows the response of the gain as a function of the control voltage.

DETAILED DESCRIPTION OF THE DRAWINGS

Figure 1:
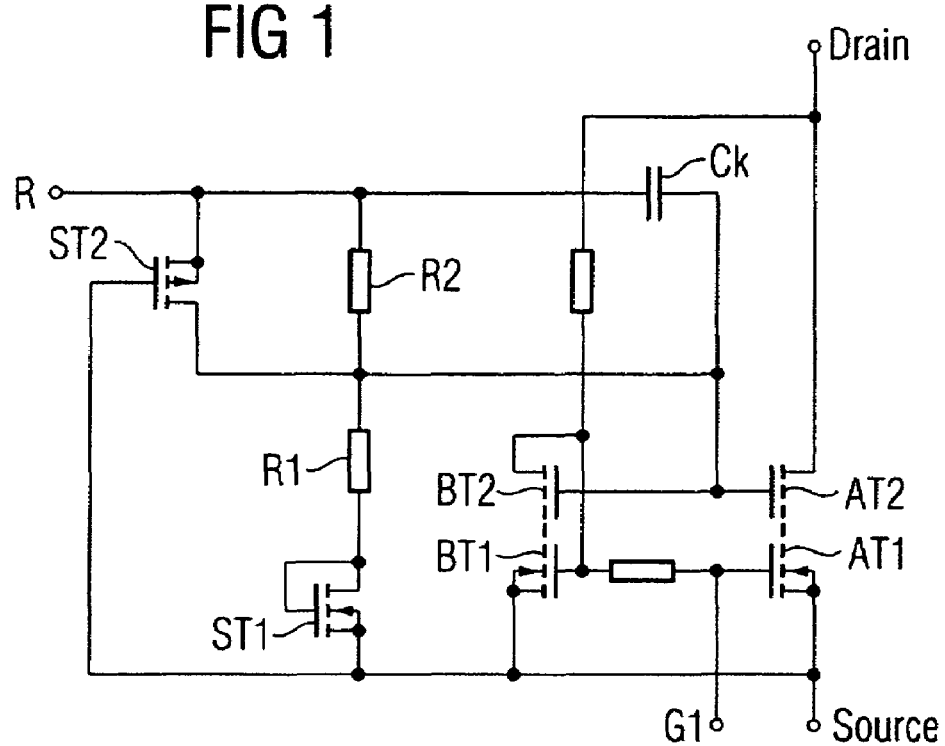
FIG. 1 shows a first embodiment of a circuit arrangement according to the invention.

FIG. 1 shows an embodiment of a circuit arrangement according to the invention. In this case, the circuit arrangement shown in FIG. 1 comprises two cascaded field effect transistors AT1 and AT2, which are arranged between a source terminal and a drain terminal. Also provided is an input signal terminal E, which is connected to the gate electrode of the first operating transistor AT1. A control voltage terminal R is correspondingly provided, which is connected to the gate electrode of the second operating transistor AT2.

The resistors R1 and R2 form a voltage divider, which is arranged between the control voltage terminal R and the gate electrode of the second operating transistor AT2. The voltage divider therefore comprises a first arm with the first resistor R1 and a second arm with the second resistor R2, the gate electrode of the second operating transistor AT2 being connected to a node N which is arranged between the first and the second arm of the voltage divider, and the control voltage terminal R being connected to the second arm of the voltage divider.

Furthermore, a first circuit unit is provided, which is connected via the resistors R1 and R2 to the control voltage terminal R and which can activate the voltage divider above a first, predefined threshold voltage. In the embodiment shown in FIG. 1, the first circuit unit provided is a first control transistor ST1, which is connected in the first arm of the voltage divider, in series with the first resistor R1, the drain terminal of the first control transistor ST1 and the gate electrode of the first control transistor ST1 being connected. Furthermore, the first control transistor ST1 has the same threshold voltage as the second operating transistor AT2.

Furthermore, a second circuit unit is provided, which is connected to the control voltage terminal R and which deactivates the voltage divider above a second, predefined threshold voltage, which is greater than the first threshold voltage. In the embodiment shown in FIG. 1, the second circuit unit has a second control transistor ST2, which is connected in the second arm of the voltage divider, parallel with the second resistor R2. In this example, the second control transistor ST2 is a p-channel transistor of the "normally off" type.

Moreover, a bias circuit for the gate electrode of the first operating transistor AT1 is provided. In the embodiment shown in FIG. 1, the bias circuit comprises two cascaded field effect transistors BT1 and BT2, whose gate electrodes are connected to the gate electrodes of the first and second operating transistors AT1 and AT2, respectively. The cascaded field effect transistors BT1 and BT2 are arranged in parallel with the cascaded operating transistors AT1 and AT2, between the source and the drain connection. In order to improve the gain, feedback and cross-coupling characteristics, the control voltage terminal R is additionally connected via a capacitor Ck to the gate electrode of the second operating transistor AT2.

The following embodiments consider the control response always starting from the fully ramped-down state in the direction of ramping up, that is to say, in the following text, the behavior is described as a function of an increase in control voltage on the control voltage terminal R. The first control transistor ST1, which has the same threshold voltage as the second operating transistor AT2, activates the voltage divider only above this threshold voltage. Until then, the controlling voltage is supplied unchanged to the gate electrode of the second operating transistor AT2. In this way, neither the turn-on voltage for the control nor scatter in the threshold voltages become effective to any great extent. In the subsequent range in which the second operating transistor AT2 is ramped up with the intrinsically steep part of the control path, the voltage divider becomes effective and expands the response in the ratio R1/(R1+R2).

Once the control voltage on the control voltage terminal R reaches the second threshold voltage, the second control transistor ST2 becomes active. This results in the second control transistor ST2 bridging the second resistor R2 and thus rendering the latter ineffective. Correspondingly, the voltage divider as a whole also becomes ineffective, and the control voltage is again supplied substantially unchanged to the gate electrode of the second operating transistor AT2. Accordingly, the subsequent, slowly rising part of the control path is shortened to a great extent as compared with conventional control. This is associated with an increase in the load for the control voltage, which in turn is associated, with the advantage that a negative-feedback effect on the entire system occurs, that is to say the control threshold of the control transistor ST2 does not become effective abruptly. A corresponding response of the gain as a function of the control voltage is shown in FIG. 2. Here, curve 1 shows the response of the gain which is established with the circuit arrangement according to the invention, while curve 2 shows the response of the gain which is established in the case of the circuit arrangement according to the prior art.

Figure 3:
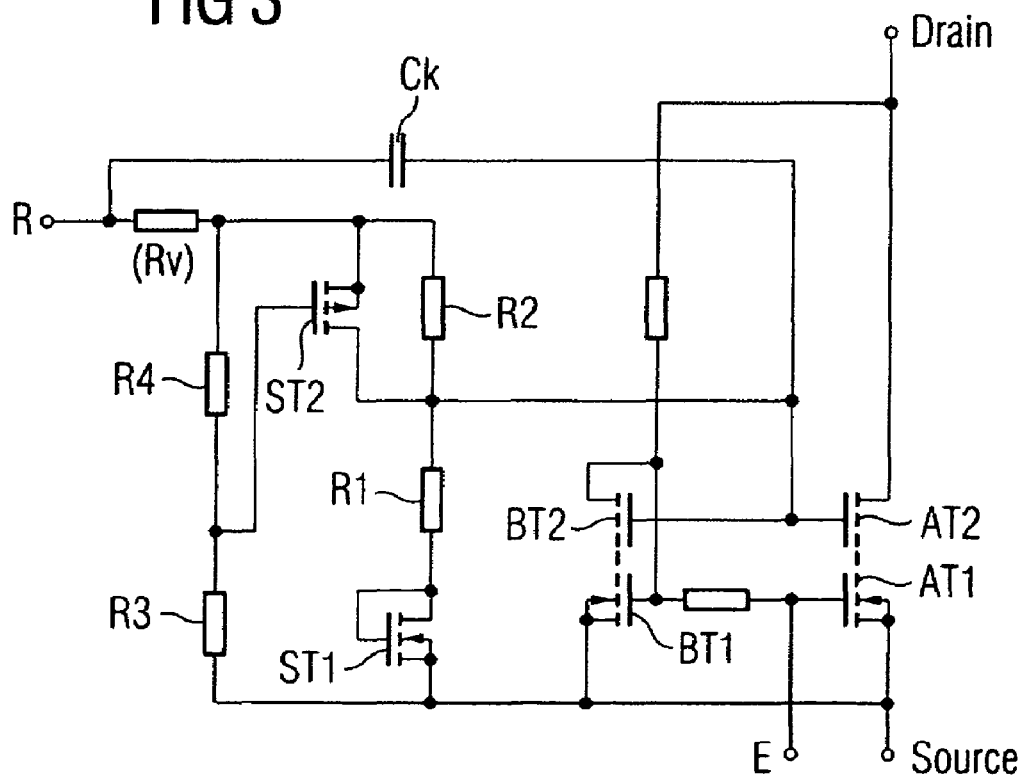
FIG. 3 shows a second embodiment of a circuit arrangement according to the invention.

FIG. 3 shows a second embodiment of a circuit arrangement according to the invention. The second embodiment substantially corresponds to the first embodiment, with the exception of the following differences. In addition to the second control transistor ST2, which is connected in the second arm of the voltage divider, parallel to the second resistor R2, the second circuit unit of the embodiment shown in FIG. 3 has a second voltage divider, which is formed by the resistors R3 and R4. In this case, the second voltage divider is arranged between the gate electrode of the second control transistor ST2 and the control voltage terminal R. It is therefore possible for the threshold voltage for the second circuit unit to be set via the second voltage divider.

A further resistor Rv can optionally be provided upstream of the second voltage divider. In the case of a very low source impedance, the compression phase can be extended by this resistor Rv.

Figure 4:
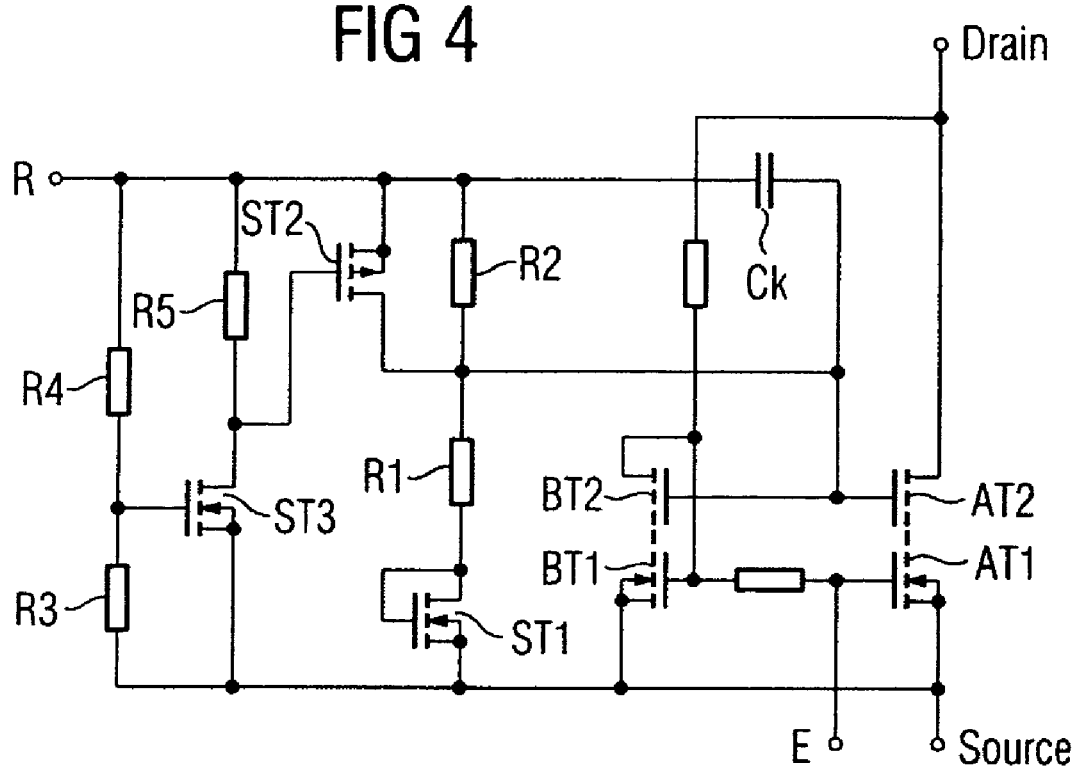
FIG. 4 shows a further embodiment of a circuit arrangement according to the invention.

FIG. 4 shows a further embodiment of a circuit arrangement according to the invention. The further embodiment substantially corresponds to the second embodiment, with the exception of the following differences. In addition to the second control transistor ST2 and the second voltage divider formed by the resistors R3 and R4, the second circuit unit, in the embodiment shown in FIG. 4 has a further control transistor ST3 and a further resistor R5.

As a result of an increase in the control voltage, the control transistor ST3 is ramped up, which in turn means that the second control transistor ST2 is turned on. The turn-on voltage of the further control transistor ST3 multiplied by the divider ratio R4/(R4+R3) of the second voltage divider therefore determines the threshold voltage for the second circuit unit. In this case, the threshold for control transistor ST3 should be as high as possible, in order to keep the multiplication factor R4/(R3+R4) small (multiplication of the tolerances).

Figure 5:
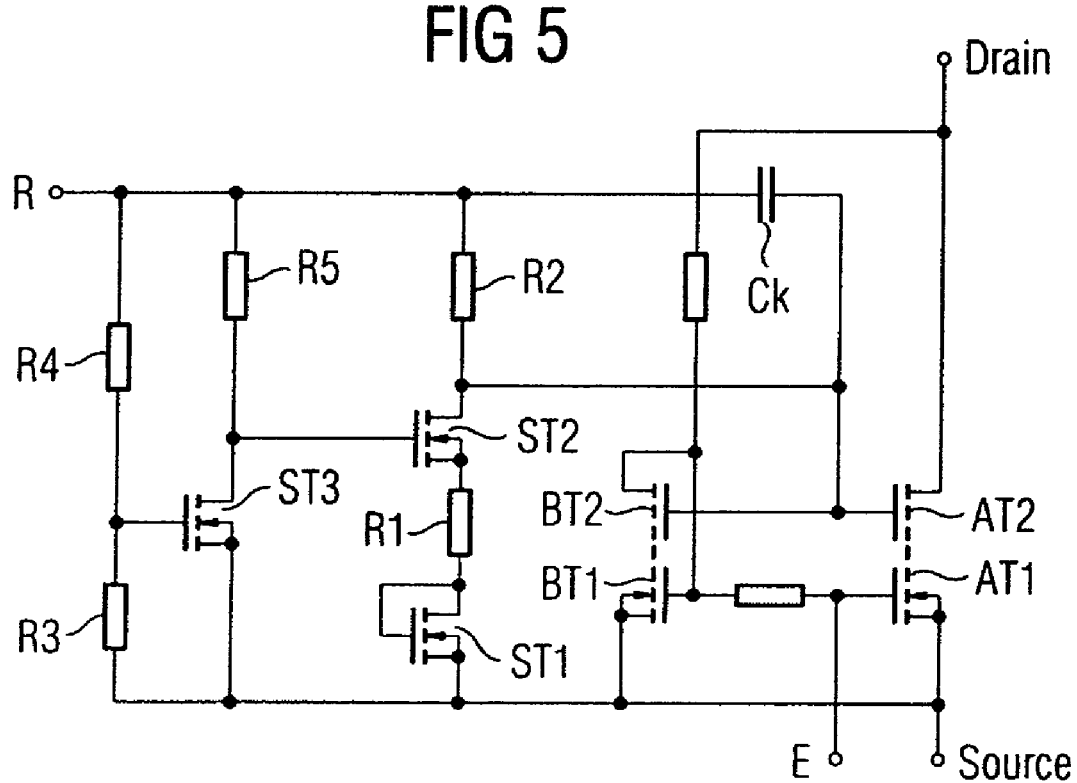
FIG. 5 shows a further embodiment of a circuit arrangement according to the invention.

FIG. 5 shows a further embodiment of a circuit arrangement according to the invention. As opposed to the embodiments shown previously, the second circuit unit in the embodiment shown in FIG. 5 has a second control transistor ST2, which is connected in the first arm of the voltage divider, in series with the first resistor R1. In this embodiment, the second control transistor ST2 is an n-channel transistor of the "normally on" type.

As a result of an increase in the control voltage, the control transistor ST3 is ramped up, which in turn means that the second control transistor ST2 is turned off. Accordingly, the first arm of the first voltage divider becomes ineffective and the control voltage is in turn supplied substantially unchanged to the gate electrode of the second operating transistor AT2. Again, the turn-on voltage of the further control transistor ST3 multiplied by the divider ratio R4/(R4+R3) of the second voltage divider therefore determines the threshold voltage for the second circuit unit.

Figure 6:
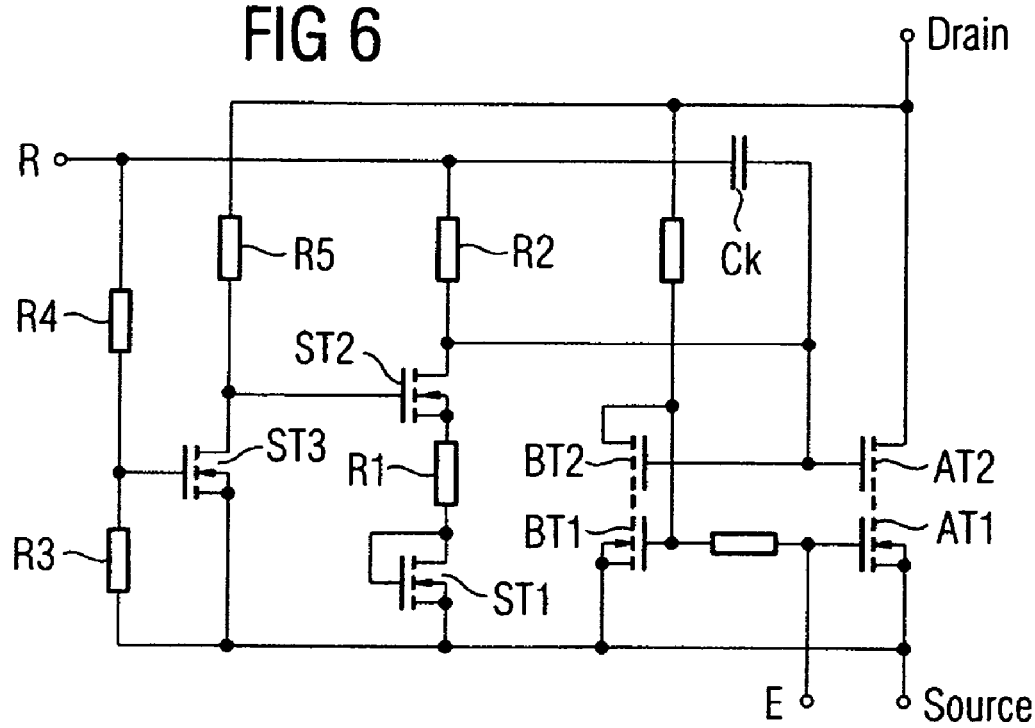
FIG. 6 shows a further embodiment of a circuit arrangement according to the invention.

FIG. 6 shows a further embodiment of a circuit arrangement according to the invention. The further embodiment substantially corresponds to the embodiment shown in FIG. 5, with the exception of the following differences. Instead of an n-channel transistor of the "normally on" type, in the case of this embodiment an n-channel transistor of the "normally off" type is used as the second control transistor ST2. In addition, the resistor R5 in this embodiment is not connected directly to the control voltage terminal R but to the drain terminal.

As a result of an increase in the control voltage, the control transistor ST3 is ramped up, which in turn means that the second control transistor ST2 is turned off. Accordingly, the first arm of the first voltage divider becomes ineffective and the control voltage is in turn supplied substantially unchanged to the gate electrode of the second operating transistor AT2. In order that this takes place moderately, the second control transistor ST2 is inserted into the first arm of the first voltage divider between R1 and R2. The resistor R1 on the source of the control transistor ST2 in this case has a high negative-feedback effect and therefore prevents an abrupt transition. The threshold for control transistor ST3 should be as high as possible, in order to keep the multiplication factor R4/(R3+R4) small (multiplication of the tolerances). Since the operating transistor AT1 has a generally higher threshold, because of the bias circuit, this implementation is expediently also used for the control transistor ST2. Of course, higher threshold values resulting from combined or other implementations are also possible.

Figure 7:
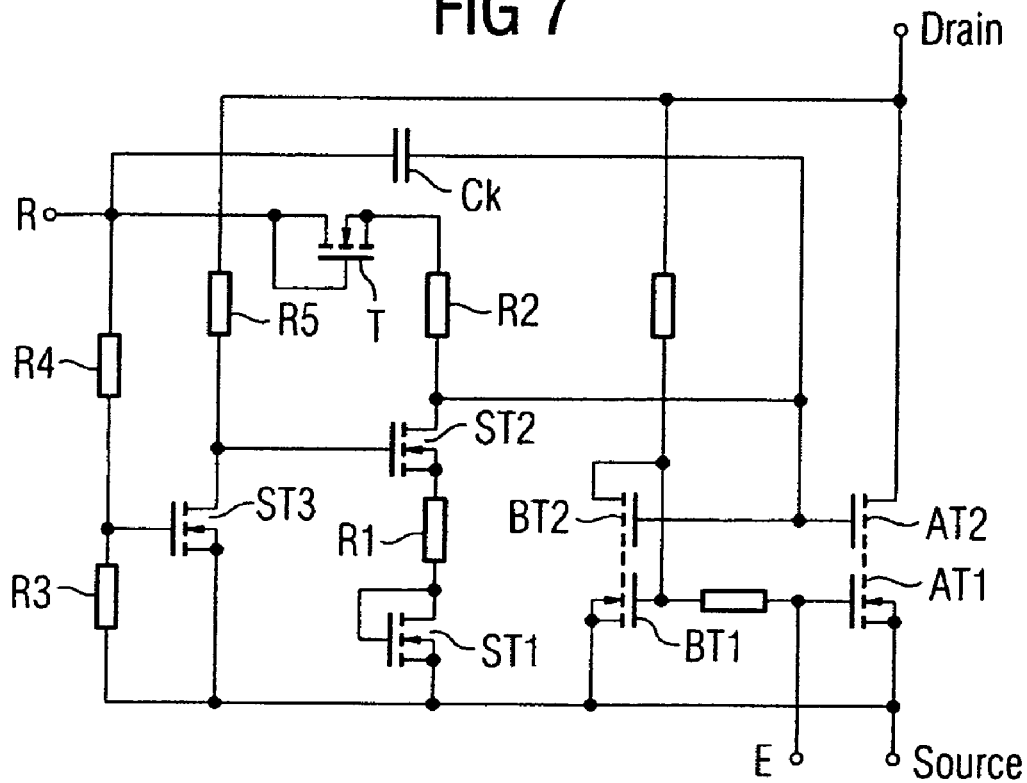
FIG. 7 shows a further embodiment of a circuit arrangement according to the invention.
Figure 8:
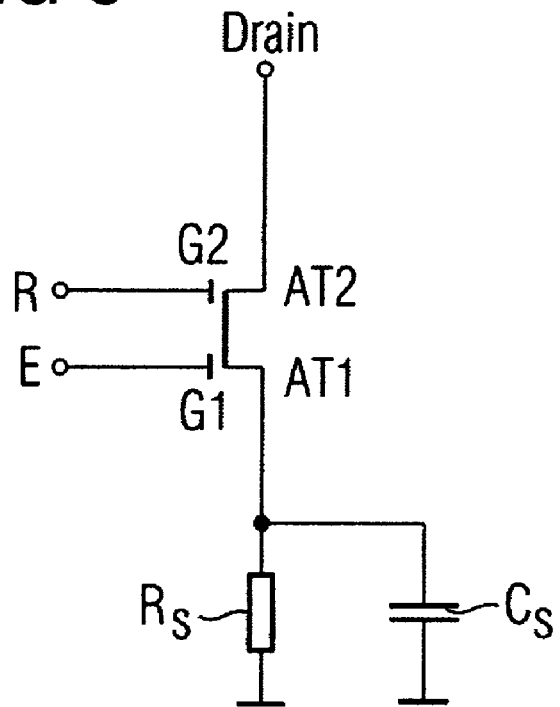
FIG. 8 shows an embodiment of a circuit arrangement according to the prior art.
Figure 9:
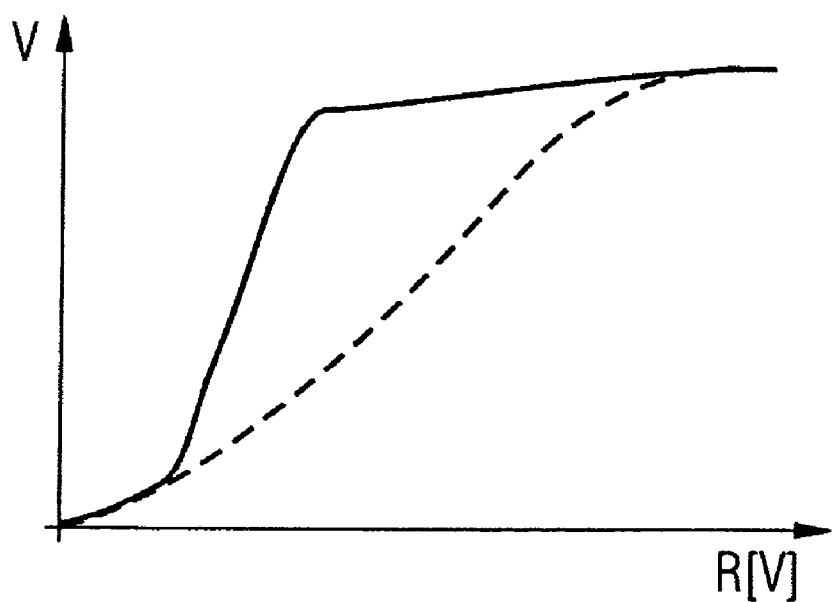
FIG. 9 shows the response of a circuit arrangement according to the prior art without a source resistor $R_s$ (continuous line) and with a source resistor $R_s$ (dashed line)

FIG. 7 shows a further embodiment of a circuit arrangement according to the invention. The further embodiment substantially corresponds to the embodiment shown in FIG. 6, with the exception of the following difference. The circuit arrangement shown in FIG. 7 differs from the circuit arrangement shown in FIG. 6 in an additional voltage offset in the driving of the gate electrode of the second operating transistor AT2. If the operating transistor AT2 has, for example, a very low turn-on voltage but a considerably higher turn-on voltage is to be ensured on the component, then this can be achieved by means of an additional transistor T.

The circuit arrangement according to the invention is based on extending the control path by means of a voltage divider R1 and R2, which supplies the control voltage divided in the ratio R1/(R1+R2) to the gate electrode of the second operating transistor AT2.

However, this extension is intended to relate only to the steep part of the control path. Accordingly, the first and second circuit unit are provided to place the turn-on voltage correctly and to shorten the elongated flat upper part of the control characteristic considerably and position it correctly. Furthermore, scatter in the turn-on voltages is, if possible, intercepted or compensated for instead of being multiplied by the divider voltages.

The invention claimed is:

1. A cascaded field effect transistor circuit comprising:
   a first operating transistor and a second operating transistor connected in series between a source terminal and a drain terminal,
   an input signal terminal connected to a gate electrode of the first operating transistor,
   a control voltage terminal connected to the gate electrode of the second operating transistor,
   a voltage divider connected between the control voltage terminal and the gate electrode of the second operating transistor,
   a first circuit unit connected to the control voltage terminal and including mean for activating the voltage divider above a first, predefined threshold voltage, and
   a second circuit unit connected to the control voltage terminal and including means for deactivating the voltage divider above a second, predefined threshold voltage, which is higher than the first threshold voltage.

2. The circuit as claimed in claim 1,
wherein the voltage divider comprises a first arm including at least one first resistor and a second arm including at least one second resistor that is connected to the first arm at a node,
wherein the gate electrode of the second operating transistor is connected to the node located between the first and the second arm of the voltage divider, and
wherein the control voltage terminal is connected to the second arm of the voltage divider.

3. The circuit arrangement as claimed in claim 2, wherein the first circuit unit comprises a first control transistor connected in the first arm of the voltage divider, in series with the first resistor.

4. The circuit arrangement as claimed in claim 3, wherein the first control transistor has a threshold voltage that is equal to a threshold voltage of the second operating transistor.

5. The circuit arrangement as claimed in claim 3, wherein a the drain terminal of the first control transistor and a gate electrode of the first control transistor are connected.

6. The circuit arrangement as claimed in claim 2, wherein the second circuit unit comprises at least one second control transistor connected in the second arm of the voltage divider, parallel to the second resistor.

7. The circuit arrangement as claimed in claim 6, wherein the second control transistor is a p-channel transistor.

8. The circuit arrangement as claimed in claim 2, wherein the second circuit unit comprises at least one second control transistor, which is connected in the first arm of the voltage divider, in series with the first resistor.

9. The circuit arrangement as claimed in claim 8, wherein the second control transistor is an n-channel transistor.

10. The circuit arrangement as claimed in claim 1, further comprising a capacitor connected between the control voltage terminal and the gate electrode of the second operating transistor.

11. The circuit arrangement as claimed in claim 1, further comprising a bias circuit connected to the gate electrode of the first operating transistor.

12. The circuit arrangement as claimed in claim 11, wherein the bias circuit comprises at least two cascaded field effect transistors, whose gate electrodes are connected to the gate electrodes of the first and second operating transistors, respectively.

13. A circuit comprising:
first and second cascaded field effect transistors (FETs) connected between a source terminal and a drain terminal, wherein a gate terminal of the first FET is connected to receive an input signal;
a voltage divider including a first resistive leg and a second resistive connected in series and defining a node therebetween, wherein the second resistive leg is connected between a gate terminal of the second FET and a control voltage terminal;
a first control transistor having a gate terminal and a first terminal to the first resistive leg, and a second terminal connected to the source terminal; and
a second control transistor connected in parallel between the control voltage terminal and the node defined by the voltage divider.

14. A circuit including a source terminal, a drain terminal, an input terminal for receiving an input signal, and a control voltage terminal for receiving an applied control voltage, the circuit comprising:
cascaded first and second field effect transistors (FETs) connected between the source terminal and the drain terminal, wherein a gate terminal of the first FET is connected to the input terminal;
a voltage divider including a first resistive leg and a second resistive connected in series and defining a node therebetween, wherein the second resistive leg is connected between a gate terminal of the second FET and the control voltage terminal; and
means for selectively enabling and disabling the voltage divider such that when the applied control voltage is at a first voltage level, the voltage divider is enabled such that a portion of the applied control voltage is transmitted to the gate terminal of the second FET, and when the applied control voltage is at a second voltage level, the voltage divider is disabled such that the applied control voltage is transmitted substantially unchanged to the gate terminal of the second FET.

* * * * *